(12) United States Patent
Mattson

(10) Patent No.: US 6,780,655 B2
(45) Date of Patent: Aug. 24, 2004

(54) METHODS OF FORMING MAGNETORESISTIVE MEMORY DEVICES

(75) Inventor: John Mattson, Waldorf, MD (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/632,579

(22) Filed: Jul. 31, 2003

(65) Prior Publication Data

US 2004/0021190 A1 Feb. 5, 2004

Related U.S. Application Data

(62) Division of application No. 10/196,484, filed on Jul. 15, 2002.

(51) Int. Cl.⁷ .............................................. H01L 21/00
(52) U.S. Cl. ........................... 438/3; 438/238; 438/239; 438/257; 257/295; 257/296; 257/421; 257/422; 257/903
(58) Field of Search ........................... 438/3, 104, 238, 438/239, 241, 242, 257, 386, 672, 692; 257/295, 296, 421, 422, 903–908

(56) References Cited

U.S. PATENT DOCUMENTS

| | | |
|---|---|---|
| 4,731,757 A | 3/1988 | Daughton et al. |
| 4,780,848 A | 10/1988 | Daughton et al. |
| 5,060,193 A | 10/1991 | Daughton et al. |
| 5,496,759 A | 3/1996 | Yue et al. |
| 5,569,617 A | 10/1996 | Yeh et al. |
| 5,576,914 A | 11/1996 | Rottmayer et al. |
| 5,756,366 A | 5/1998 | Berg et al. |
| 5,784,224 A | 7/1998 | Rottmayer et al. |
| 5,859,754 A | 1/1999 | Tong et al. |
| 5,956,267 A | 9/1999 | Hurst et al. |
| 5,998,016 A | 12/1999 | Sasaki et al. |
| 6,048,739 A | 4/2000 | Hurst et al. |
| 6,165,803 A * | 12/2000 | Chen et al. ..................... 438/3 |
| 6,185,077 B1 | 2/2001 | Tong et al. |
| 6,211,090 B1 * | 4/2001 | Durlam et al. ............... 438/692 |
| 6,261,893 B1 | 7/2001 | Chang et al. |
| 2002/0186582 A1 | 12/2002 | Sharma et al. |
| 2003/0146439 A1 | 8/2003 | Katti et al. |

* cited by examiner

Primary Examiner—David Nelms
Assistant Examiner—Long Tran
(74) Attorney, Agent, or Firm—Wells St. John P.S.

(57) ABSTRACT

The invention includes a method of forming a magnetoresistive memory device. A trench is formed in an insulative material, and the trench is partially filled with a first magnetic material to narrow the trench. The narrowed trench is at least partially filled with a conductive material. A second magnetic material is formed over the conductive material. A non-magnetic layer is formed over the second magnetic material. A third magnetic material is formed over the non-magnetic layer. The conductive material and the first and second magnetic materials are incorporated into a sense portion of the magnetoresistive memory device. The third magnetic material is incorporated into a reference portion of the magnetoresistive memory device.

20 Claims, 9 Drawing Sheets

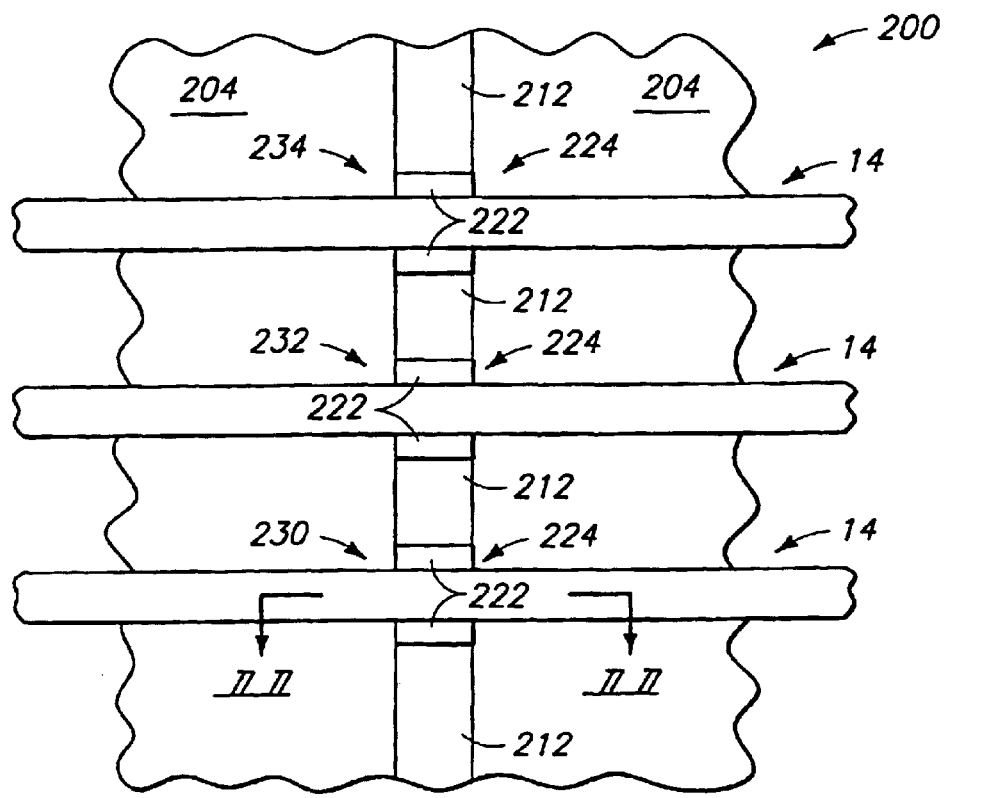
$\mathbb{F}_{L}\mathbb{F}_{L}\mathbb{F}$ 10
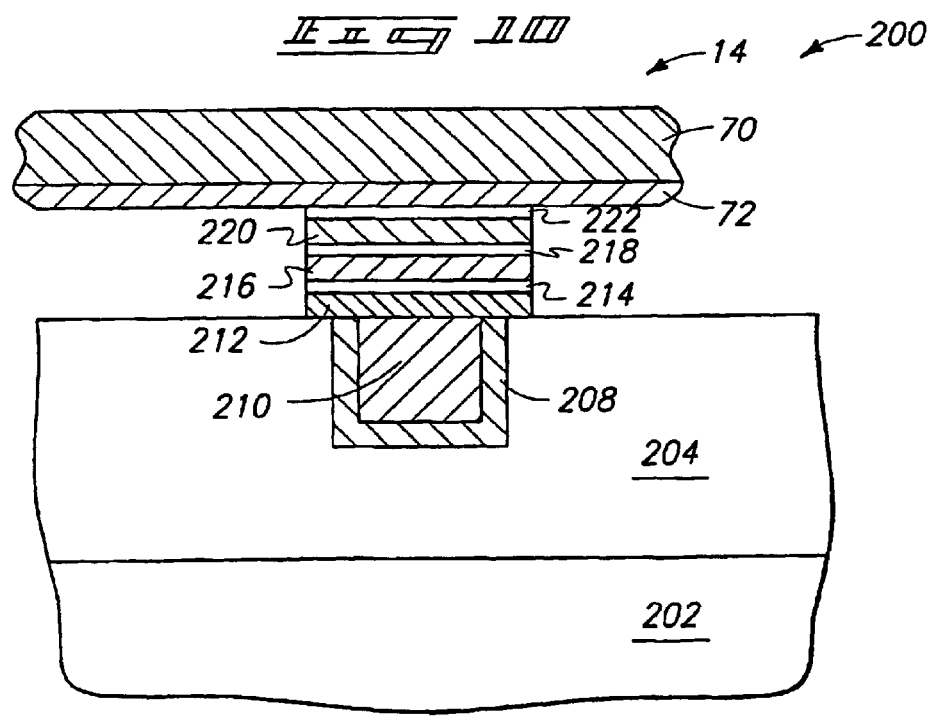
$\mathbb{F}_{L}\mathbb{F}_{L}\mathbb{F}$ 11

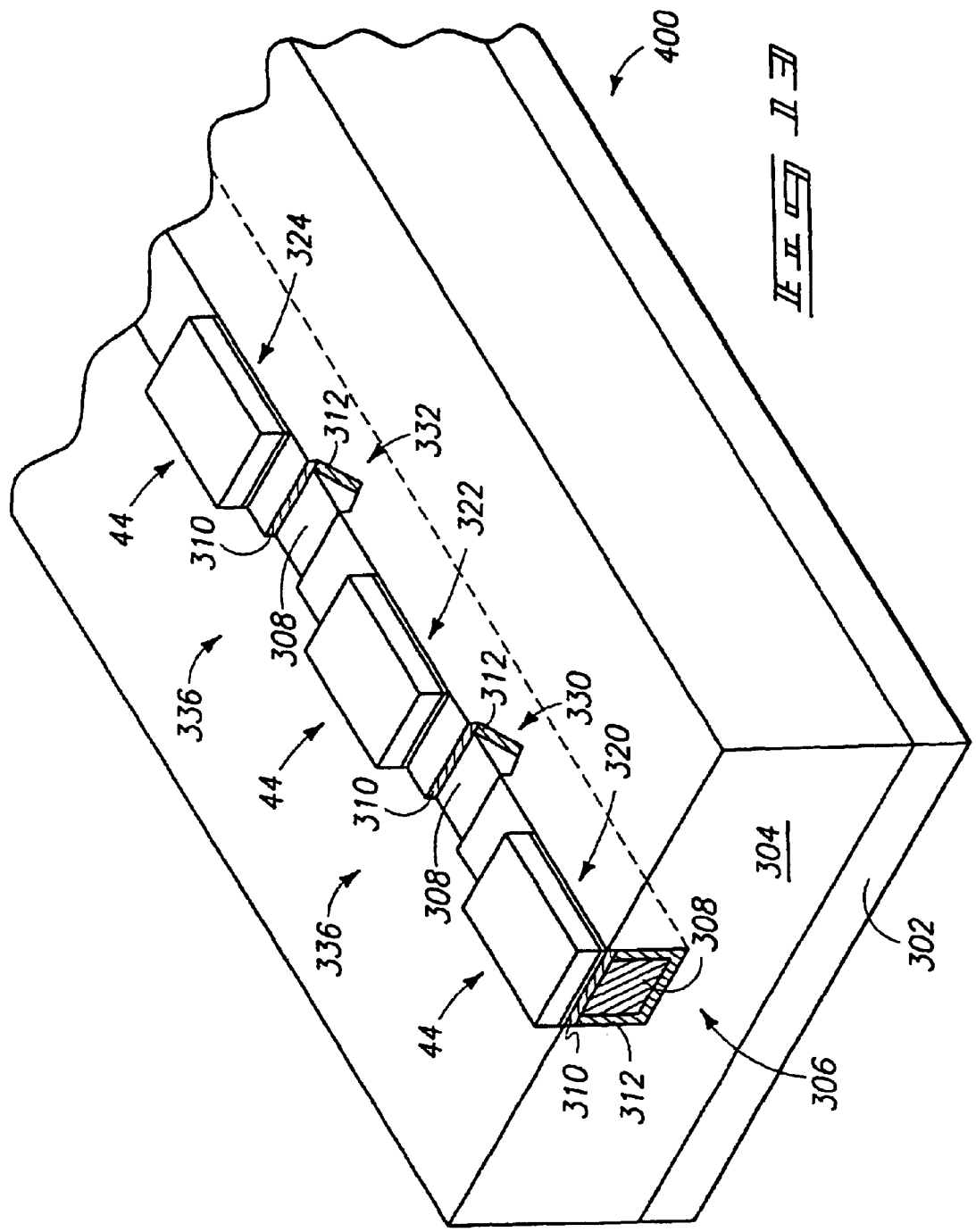

US 6,780,655 B2

METHODS OF FORMING MAGNETORESISTIVE MEMORY DEVICES

This patent is a divisional of U.S. patent application Ser. No. 10/196,484, which was filed on Jul. 15, 2002.

TECHNICAL FIELD

The invention pertains to magnetoresistive memory devices, such as, for example, magnetic random access memory (MRAM) devices, and also pertains to methods of forming magnetoresistive memory devices.

BACKGROUND OF THE INVENTION

Numerous types of digital memories are utilized in computer system components, digital processing systems, and other applications for storing and retrieving data. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the memory devices. It is noted that the term "magnetoresistive device" characterizes the device and not the access method, and accordingly a magnetoresistive device can be accessed by, for example, either inductive sensing or magnetoresistive sensing methodologies.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on power storage within capacitors. Such capacitors leak energy, and must be refreshed at approximately 15 nanosecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices can potentially remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop methodologies for making MRAM devices in which bits are stable over time and relative to stray magnetic field effects, and in which the bits can be formed by photolithographic processes and scaled as dimensions produced by photolithography decrease. Further, it would be desirable to develop MRAM devices which avoid various shape-related issues associated with some of the currently-produced MRAM devices.

SUMMARY OF THE INVENTION

In one aspect, the invention encompasses a magnetoresistive memory device. The device includes a conductive core, and a first magnetic layer extending at least partially around the conductive core. A non-magnetic material is over at least a portion of the first magnetic layer and separated from the conductive core by at least the first magnetic layer. A second magnetic layer is over the non-magnetic material, and separated from the first magnetic layer by at least the non-magnetic material.

In another aspect, the invention encompasses a method of forming a magnetoresistive memory device. A trench is formed in an insulative material, and partially filled with a first magnetic material to narrow the trench. The narrowed trench is at least partially filled with a conductive material. A second magnetic material is formed over the conductive material. A non-magnetic material is formed over the second magnetic material. A third magnetic material is formed over the non-magnetic material. The first and second magnetic materials are incorporated into a sense portion of a magnetoresistive memory device, together with the conductive material. The third magnetic material is incorporated into a reference portion of the magnetoresistive memory device.

BRIEF DESCRIPTION OF THE DRAWINGS

Preferred embodiments of the invention are described below with reference to the following accompanying drawings.

FIG. 10 is a view of the FIG. 9 wafer fragment shown at a processing step subsequent to that of FIG. 9.

FIG. 12 is a diagrammatic, fragmentary view of a semiconductor wafer construction, illustrating a portion of a magnetoresistive memory construction encompassed by the present invention.

FIG. 13 is a diagrammatic, fragmentary view of a semiconductor wafer illustrating another embodiment portion of a magnetoresistive memory array encompassed by the present invention.

FIG. 14 is a diagrammatic, fragmentary view of a semiconductor wafer illustrating yet another embodiment of a magnetoresistive memory array encompassed by the present invention.

DETAILED DESCRIPTION OF THE PREFERRED EMBODIMENTS

The invention encompasses magnetoresistive memory devices, and methods of forming magnetoresistive memory devices. An array of magnetoresistive memory devices is described with reference to FIGS. 1 and 2. More specifically, FIG. 1 illustrates a memory array 10 comprising magnetoresistive memory array device bitlines 12, and a series of wordlines 14; and FIG. 2 illustrates a cross-sectional view of a memory element along the line 2—2 of FIG. 1.

Figure 1:
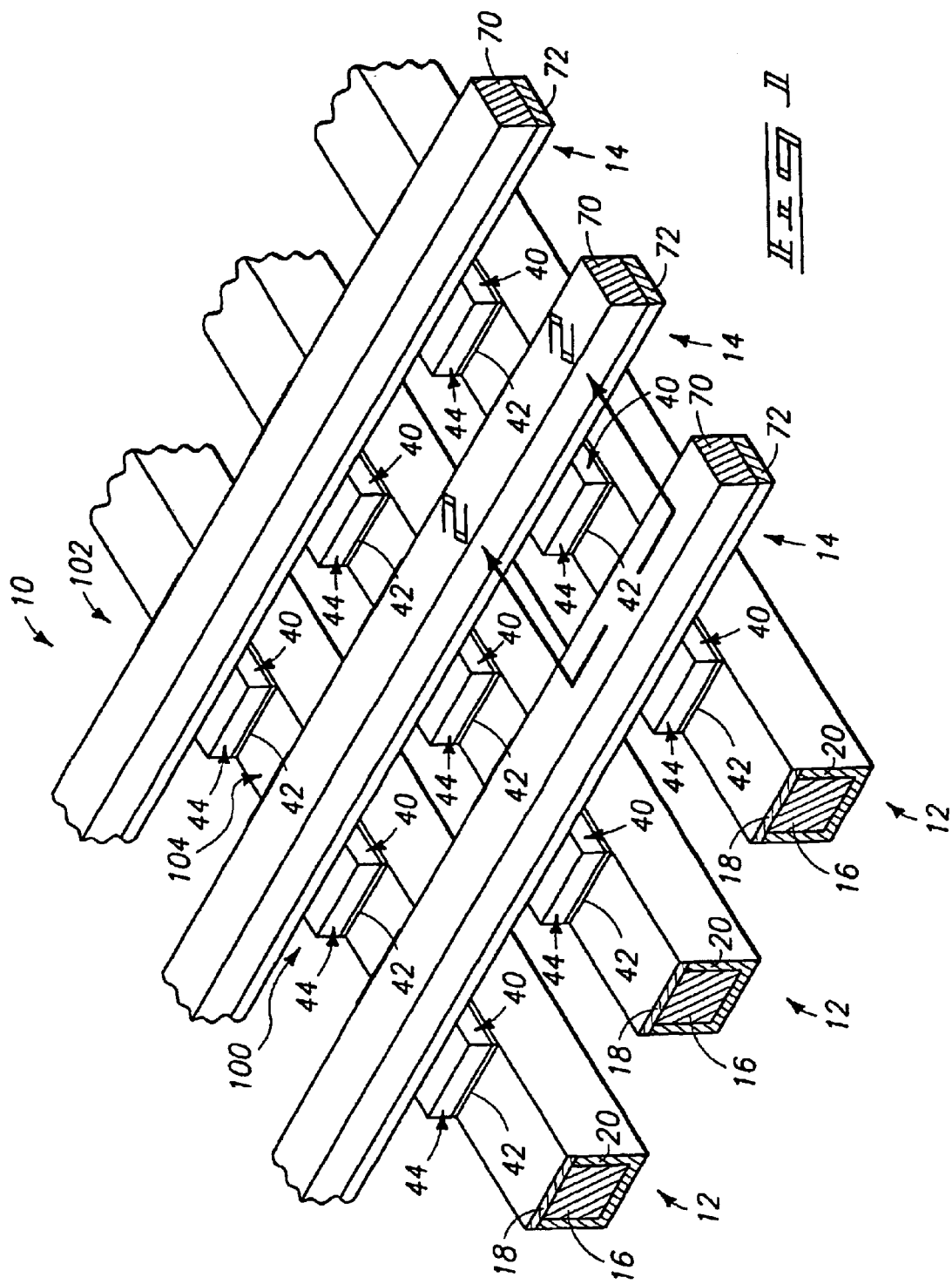
FIG. 1 is a diagrammatic, isometric view of a magnetoresistive memory array encompassed by the present invention.
Figure 2:
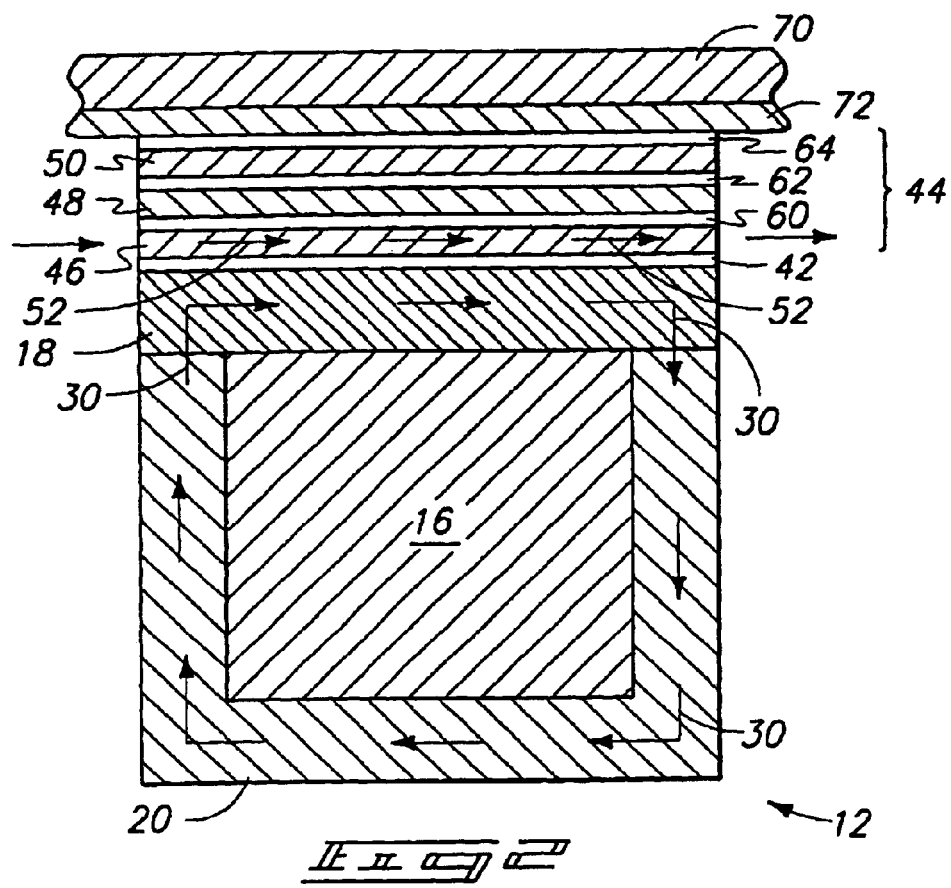
FIG. 2 is a diagrammatic, cross-sectional view of a portion of the FIG. 1 array, along the line 2—2 of FIG. 1.

The memory array structure of FIG. 1 is illustrated in isolation from any supporting substrate to simplify the drawing. It is to be understood, however, that the memory array structure would typically be supported by a substrate, such as, for example, a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The bitline elements 12 each comprise a conductive core 16 surrounded by magnetic materials 18 and 20. Conductive core 16 can comprise any material having suitable conductivity, including, for example, materials comprising one or more of copper, aluminum and silver.

Magnetic layers 18 and 20 can be referred to as a first magnetic layer and a second magnetic layer, respectively. In particular embodiments, magnetic layers 18 and 20 can be identical to one another, and in other embodiments the magnetic layers can be different from one another. Layers 18 and 20 can be considered to together define a magnetic layer which extends entirely around conductive core 16. In the shown embodiment, first magnetic layer 18 extends at least partially around conductive core 16 (and specifically extends along a top surface of conductive core 16). First magnetic layer 18 can comprise, for example, magnetic materials having so-called soft magnetic properties, such as, for example, materials primarily comprising one or both of iron and nickel. The magnetic material of layer 18 can further comprise small amounts of tantalum, niobium, and chromium, for example. Second magnetic layer 20 preferably also comprises a material having soft magnetic properties, such as, for example, a material comprising primarily one or both of iron and nickel. Second magnetic layer 20 can differ from first magnetic layer 18 either in chemical composition, or in a thickness of layer 20. In particular embodiments, layer 18 comprises a material primarily composed of iron and/or nickel, and layer 20 comprises a material primarily composed of cobalt, chromium and niobium. Magnetic materials 18 and 20 will preferably have low magnetostriction, and low anisotropy of magnetic fields formed therein.

A magnetic field can be induced within magnetic materials 18 and 20 by flowing a current along conductive material 16. Such is indicated in FIG. 2, wherein a magnetic field within materials 16 and 18 is indicated by arrows 30 (only some of which are labeled). In the shown embodiment, the arrows 30 extend clockwise around conductive core 16. Such orientation can occur by flowing a current into the page. Alternatively, a counter-clockwise orientation of the magnetic field can be induced by flowing a current out of the page along conductive core 16.

Referring again to FIG. 1, bit storage units occur at the locations 40 along bit lines 12. Specifically, locations 40 comprise a non-magnetic material 42 patterned over bit lines 16, and a block 44 comprising one or more magnetic materials patterned over the non-magnetic material 42. Non-magnetic material 42 can comprise conductive materials, such as, for example, copper, and in such constructions the resulting magnetoresistive device can be referred to as a giant magnetoresistive (GMR) device. Alternatively, non-magnetic material 42 can comprise insulative material, such as, for example, aluminum oxide ($Al_2O_3$) or silicon dioxide ($SiO_2$), and in such constructions the resulting magnetoresistive device can be referred to as a tunnel magnetoresistive (TMR) device.

Magnetic block 44 is described with reference to FIG. 2. In the shown embodiment, magnetic block 44 comprises a magnetic layer 46, an antiferromagnetic pinning layer 48, and another magnetic layer 50. Magnetic layer 46 can comprise so-called soft magnetic materials, such as, for example, magnetic materials comprising predominantly one or both of iron and nickel. Antiferromagnetic pinning layer 48 can comprise, for example, iron, and has relatively hard magnetic properties so that a magnetic field direction is retained within the pinning layer. The magnetic field of the pinning layer can induce and maintain a magnetic field orientation in the soft magnetic material 46. For instance, in the shown embodiment material 46 has a magnetic field orientation indicated by arrows 52, with such magnetic field extending parallel to the shown magnetic field 30 within magnetic materials 18 and 20.

A third magnetic material 50 is provided over antiferromagnetic layer 48. Magnetic material 50 can comprise, for example, permalloy, NiFe and/or CoFe, and is provided as a reference layer.

Magnetic materials 46 and 48 are separated from one another by a non-magnetic material 60 which can comprise, for example, Ta, Ru and/or Cu; and magnetic materials 48 and 50 are separated from one another by a non-magnetic material 62 which can comprise, for example, aluminum oxide, or any suitable dielectric tunnel barrier. Material 62 can be referred to as a spacer region between materials 48 and 50.

A non-magnetic material 64 is over magnetic material 50. Non-magnetic material 64 can comprise, for example, titanium nitride.

Referring again to FIG. 1, wordlines 14 extend across bitlines 18 in an array, with the individual wordlines being substantially perpendicular to the individual bitlines. Wordlines 14 can comprise any suitable conductive material, including, for example, materials comprising one or more of copper, aluminum, conductively-doped silicon, or silver. In the shown embodiment, wordlines 14 comprise an upper conductive material 70, and a lower antiferromagnetic material 72. Upper conductive material 70 can comprise, for example, one or more of copper, aluminum, conductively-doped silicon, or silver. Antiferromagnetic material 72 can comprise, for example, one or more of nickel, cobalt and iron. A diffusion barrier layer can be provided between pinning layer 72 and conductor 70 to inhibit diffusional exchange of materials between layers 70 and 72. Such barrier layer can comprise, for example, Ta and/or Ru.

Although though pinning layer 72 is shown along only one side of conductor 70, it is to be understood that the invention encompasses other embodiments (not shown) wherein layer 72 extends along two or more sides of conductor 70, including embodiments in which layer 72 extends entirely around conductive layer 70.

Antiferromagnetic material 72 preferably comprises a composition similar to that described previously for pinning layer 48, and in particular embodiments, layer 72 can be considered a pinning layer that extends continuously as part of wordlines 14. Further, although pinning layer 72 is shown separated from pinning layer 48 by intervening materials 50, 62 and 64, it is to be understood that pinning layer 72 can be directly against pinning layer 48 in other embodiments (not shown).

In operation, data can be stored within an individual bit storage unit of the type described with reference to FIG. 2 as an orientation of magnetic field 30 relative to magnetic field 52. Specifically, if magnetic field 30 within material 18 is parallel to the magnetic field 52 within material 46 (as shown), a particular resistance or state can be detected by current flow through wordlines 14; and if magnetic field 30 is antiparallel relative to magnetic field 52, a different resistance or state can be detected. Accordingly, two stable states exist for the relative orientations of magnetic fields 30 and 52 (the so-called parallel and antiparallel magnetic field states). If one of the states is referred to as a 1, and the other as a 0, data can be stored and retrieved from the structure of FIG. 2, and accordingly such structure can correspond to a memory bit. In particular embodiments of the present invention, the effect of the antiparallel and parallel orientations on current through wordline 14 can be considered a detection of voltage drop across a junction defined by non-magnetic material 42.

The pinned magnetic orientation 52 can be referred to as a reference orientation, and the switchable orientation 30 can be referred to as a sense orientation. Accordingly, reading of a bit can be considered as a determination of the relative direction of the sense orientation to the reference orientation. Such reading can occur by detecting an influence of the magnetic orientations on current through wordline 70. Specifically, parallel orientations of the sense and reference magnetic directions will have a different influence on conductivity through wordline 14 than will antiparallel orientations. Since the reference orientation never switches, but is instead strongly pinned, the layers associated with the reference orientation (i.e., the layers associated with stack 44) can be formed in essentially any shape.

A memory bit can be written to 1 or 0 state in the FIG. 2 structure by an exemplary method in which a current is sent along bitline 16 either into or out of the page relative to the diagram of FIG. 2, to create either clockwise or counter-clockwise rotation of a magnetic moment 30 within magnetic materials 18 and 20. This can, however, be a relatively difficult procedure to implement, since it may require a separate write line for each bitline of a memory device. A second method for writing information to the bitline is to have a current line on top of the bitline which produces a field in an orthogonal direction to that of the bitline, and which accordingly reduces the field needed to switch the bit from a 1 to 0 state. Such is commonly referred to as a half-select field process. The half-select method can be a preferred method for writing information to the storage grids of memory array 10, in that it can eliminate access transistors (not shown) which may otherwise be desired or required for the memory array, and further, because the half-select field can be a relatively simple circuit to operate.

Among the advantages of the device illustrated with reference to FIGS. 1 and 2, relative to prior art devices, is that the magnetic materials 18 and 20 carry a bit of memory storage information directly adjacent to, and touching, bitline 16. This can minimize an amount of current required to write a 1 or 0 bit relative to designs in which a magnetic layer is separated from the material utilized to induce a magnetic moment in the layer by one or more intervening materials. Further, there can be inherent geometrically induced magnetic stability of the present design in that the magnetic layers 18 and 20 are wrapped around the conductive material utilized to induce a magnetic moment in such layers.

One difficulty associated with the present invention is to provide adequate domain walls between adjacent bit storage units. For instance, a pair of adjacent bit storage units 100 and 102 are labeled in FIG. 1, and an intervening region 104 is shown between the adjacent bit storage units. It is desirable to avoid or eliminate magnetic cross-talk between bit storage units 100 and 102 by forming a suitable domain wall within the region 104. Various methodologies for forming domain walls are described below with reference to FIGS. 12–14.

Figure 3:
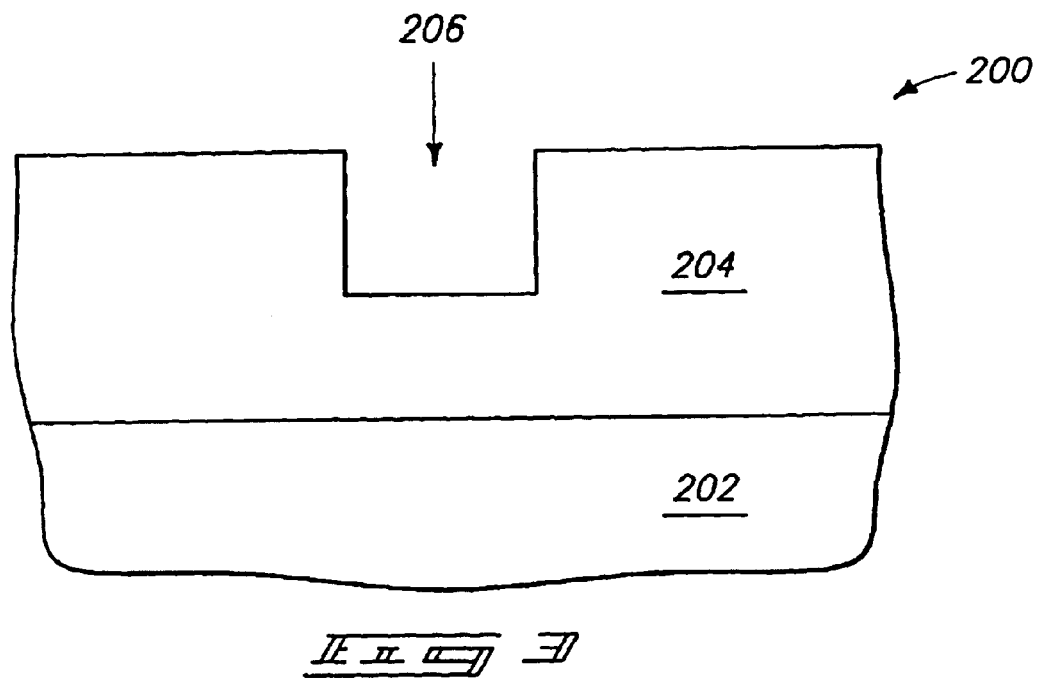
FIG. 3 is a diagrammatic, cross-sectional view of a semiconductor wafer fragment shown at a preliminary processing step of a method of the present invention for forming a magnetoresistive memory element.

A method of forming the array of FIG. 1 is described with reference to FIGS. 3–11. Referring initially to FIG. 3, a fragment of semiconductor wafer 200 is illustrated at a preliminary processing step. The fragment of wafer 200 comprises a semiconductor substrate 202 having an insulative material 204 formed thereover. Substrate 202 can comprise, for example, monocrystalline silicon, or can comprise monocrystalline silicon having numerous conductive, semiconductive and insulative materials formed thereover. Insulative material 204 can comprise, for example, silicon dioxide, silicon nitride, and/or borophosphosilicate glass (BPSG). A trench 206 is formed within insulative material 204.

Figure 4:
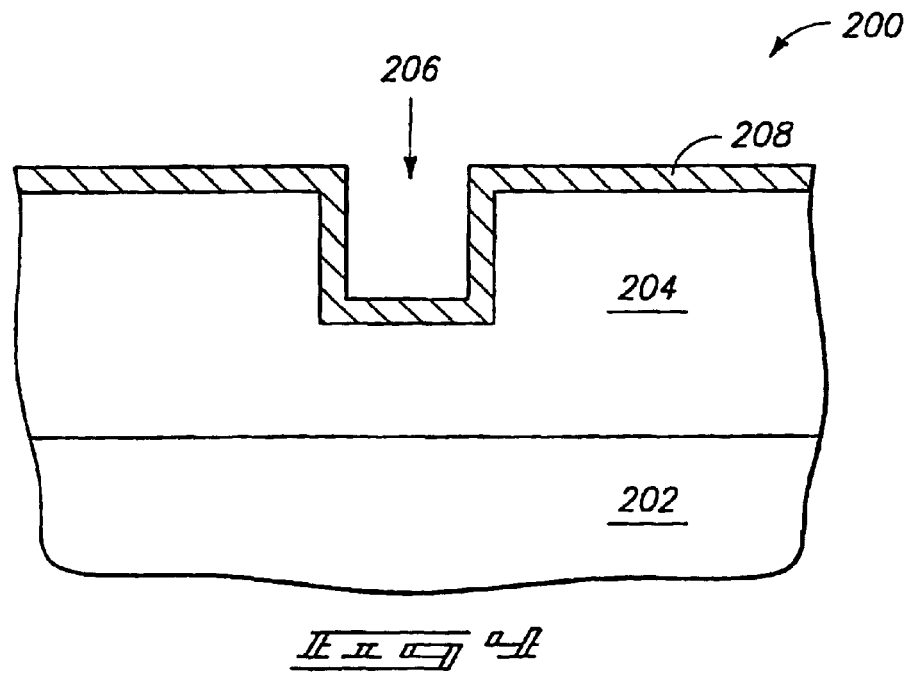
FIG. 4 is a view of the FIG. 3 wafer fragment shown at a processing step subsequent to that of FIG. 3.

Referring to FIG. 4, a magnetic material 208 is formed within trench 206 to narrow the trench. Magnetic material 208 can comprise, for example, a soft magnetic material, and can ultimately be utilized for forming the magnetic layer 20 of the FIG. 2 construction.

Figure 5:
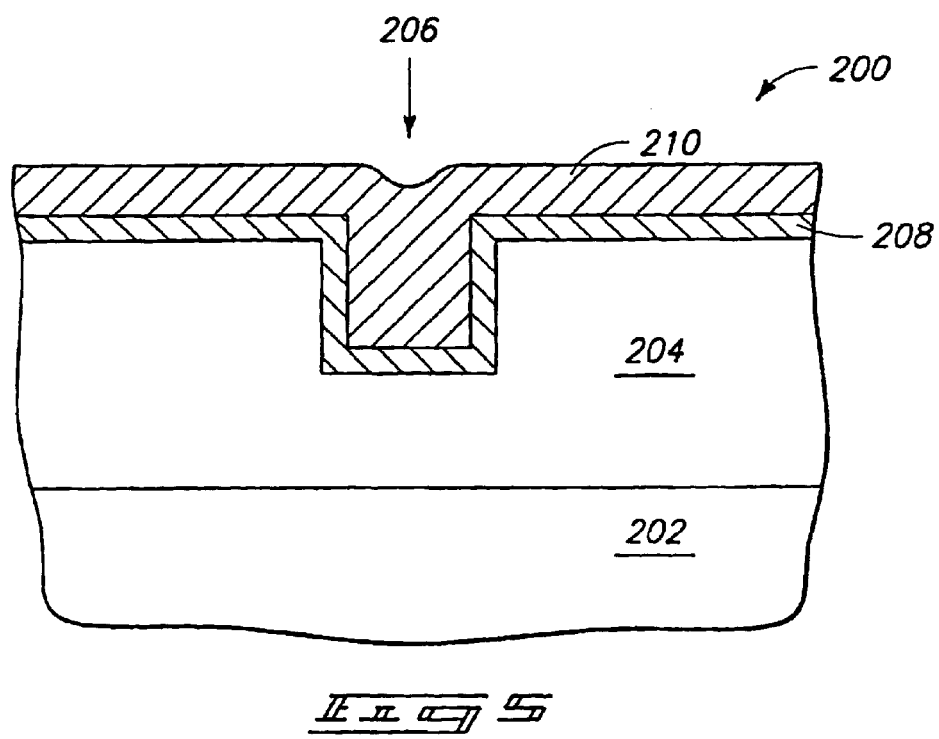
FIG. 5 is a view of the FIG. 3 wafer fragment shown at a processing step subsequent to that of FIG. 4.

Referring to FIG. 5, a conductive material 210 is provided over magnetic material 208 to fill trench 206. Conductive material 210 can ultimately be utilized to form the conductive core 16 described above with reference to FIGS. 1 and 2.

Figure 6:
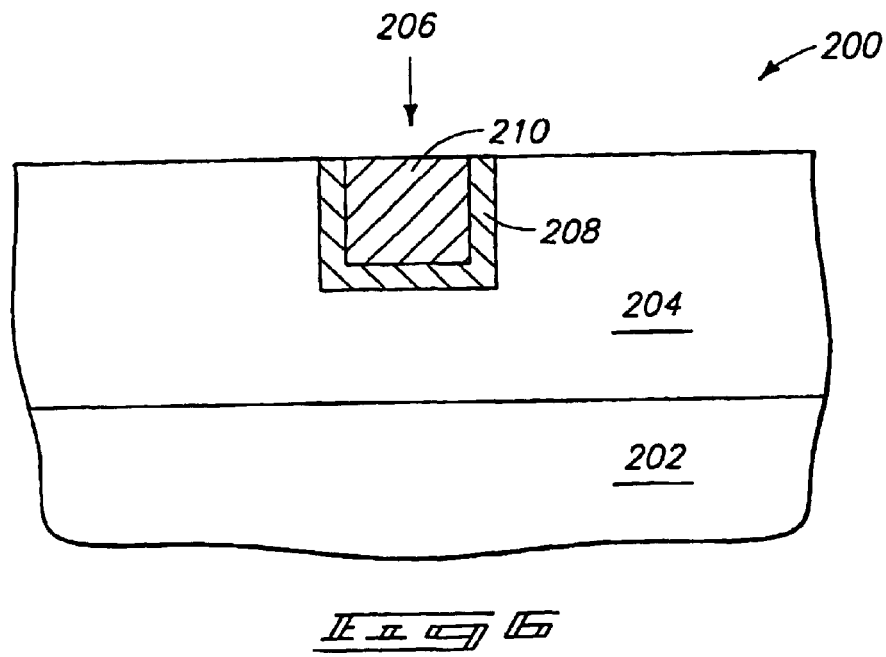
FIG. 6 is a view of the FIG. 3 wafer fragment shown at a processing step subsequent to that of FIG. 5.

Referring next to FIG. 6, materials 208 and 210 are planarized by, for example, chemical-mechanical polishing to remove the layers from over an upper surface of material 204 while leaving the layers within trench 206.

Figure 7:
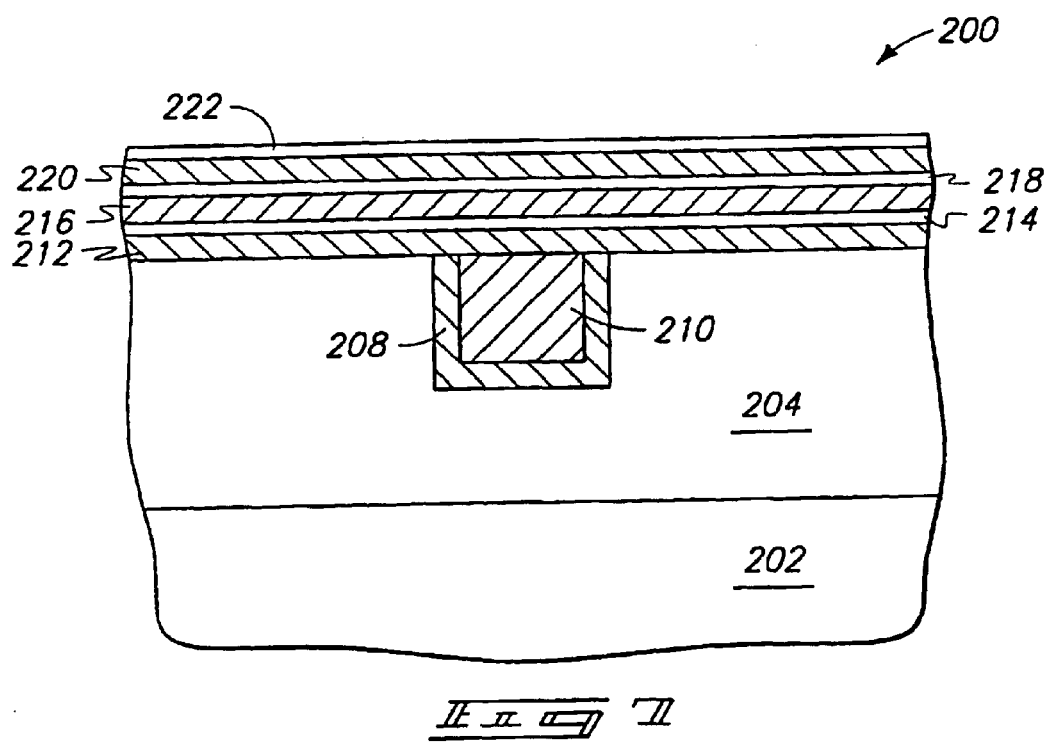
FIG. 7 is a view of the FIG. 3 wafer fragment shown at a processing step subsequent to that of FIG. 6.

Referring to FIG. 7, layers 212, 214, 216, 218, 220 and 222 are formed over substrate 204. Layers 212, 214, 216, 218, 220 and 222 can ultimately be utilized to form the layers 18, 42, 46, 60, 48, and 62, respectively. Accordingly, layer 212 comprises a soft magnetic material ultimately utilized to form part of a sense layer, while layer 216 also comprises a soft magnetic material that is utilized to form a reference layer. Layer 220, in contrast, comprises a hard magnetic material utilized to form a pinning layer. Layer 222 can comprise a material which protects layer 220, and which is selectively etchable relative to layer 220, such as, for example, titanium nitride in applications in which the antiferromagnetic layer 220 comprises one or more of the materials of NiCoO, MnFe, TbCo, or MnNi, (with the listed materials being shown in terms of primary chemical constituents, rather than the stoichiometric ratios of such constituents). Layers corresponding to layers 50 and 64 can be formed over layer 222 in aspects of the invention which are not shown.

Figure 8:
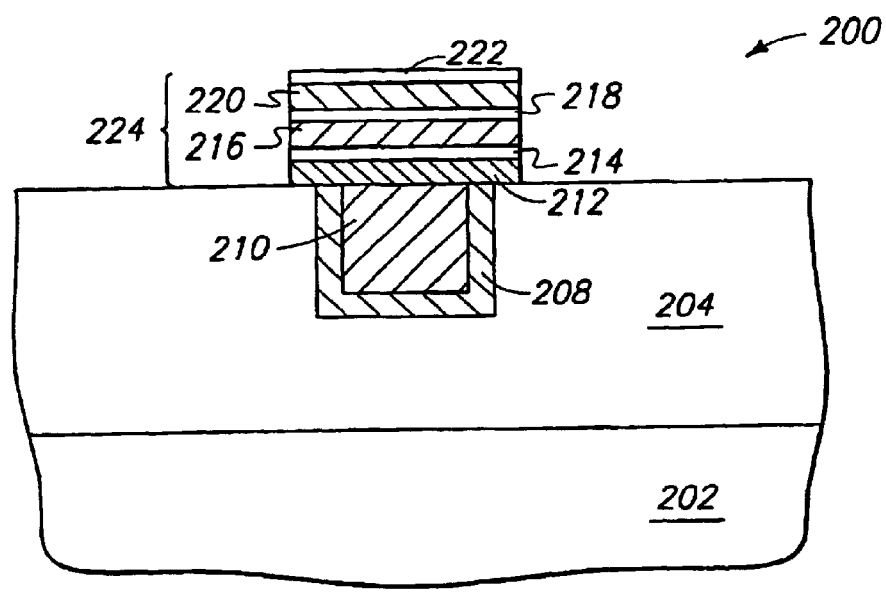
FIG. 8 is a view of the FIG. 3 wafer fragment shown at a processing step subsequent to that of FIG. 7.

Referring to FIG. 8, layers 212, 214, 216, 218, 220 and 222 are together patterned into a stack 224. Stack 224 can comprise the materials of stack 44 of FIGS. 1 and 2, together with a magnetic material (18 of FIGS. 1 and 2, and 212 of FIG. 8) associated with a sense magnetic domain of a memory bit storage unit. Stack 224 can be formed utilizing photolithographic techniques by forming a patterned photoresist block (not shown) over material 222, and subsequently etching materials 212, 214, 216, 218, 220 and 222 to transfer a pattern from the block to the underlying materials.

The shown methodology of FIG. 8 patterns portions of a reference domain of a magnetoresistive device (specifically, the pinning layer 220 and the reference magnetic layer 216), simultaneously with a non-magnetic material (layer 214) and a portion (212) of the sense magnetic domain. Such can be preferred over prior art methods which attempted to first pattern a non-magnetic layer (analogous to layer 214) and a magnetic sense layer (analogous to layer 212), and to subsequently form the reference layers (analogous to layers 216 and 220) over the patterned non-magnetic material. Non-magnetic material 214 can have important physical characteristics during operation of a magnetoresistive memory element. Specifically, material 214 influences interaction of a reference magnetic domain on one side with a sense magnetic domain on another side. Methodologies which attempted to pattern a non-magnetic layer as an upper surface could disrupt surface properties associated with the non-magnetic layer, which could later manifest as undesired influences on performance of a magnetoresistive device incorporating the non-magnetic layer.

Sense layer 212 and reference layer 216 should preferably have uniform constructions throughout their thickness and across their surfaces in order to avoid undesirably affecting performance of devices incorporating the layers. Methodology of the present invention advantageously buries sense layer 212, reference layer 216, and non-magnetic layer 214 in a stack during the patterning of such layers, which can protect surfaces of layers from being adversely affected during patterning of the layers. The top layers of the gate stack (layers 222 and 220) are layers which have higher tolerances for variations in thickness or surface properties in magnetoresistive devices, and accordingly surface effects occurring during patterning of such layers are less likely to undesirably influence a magnetoresistive device than would similar effects on the underlying layers 212, 214 and 216.

Figure 9:
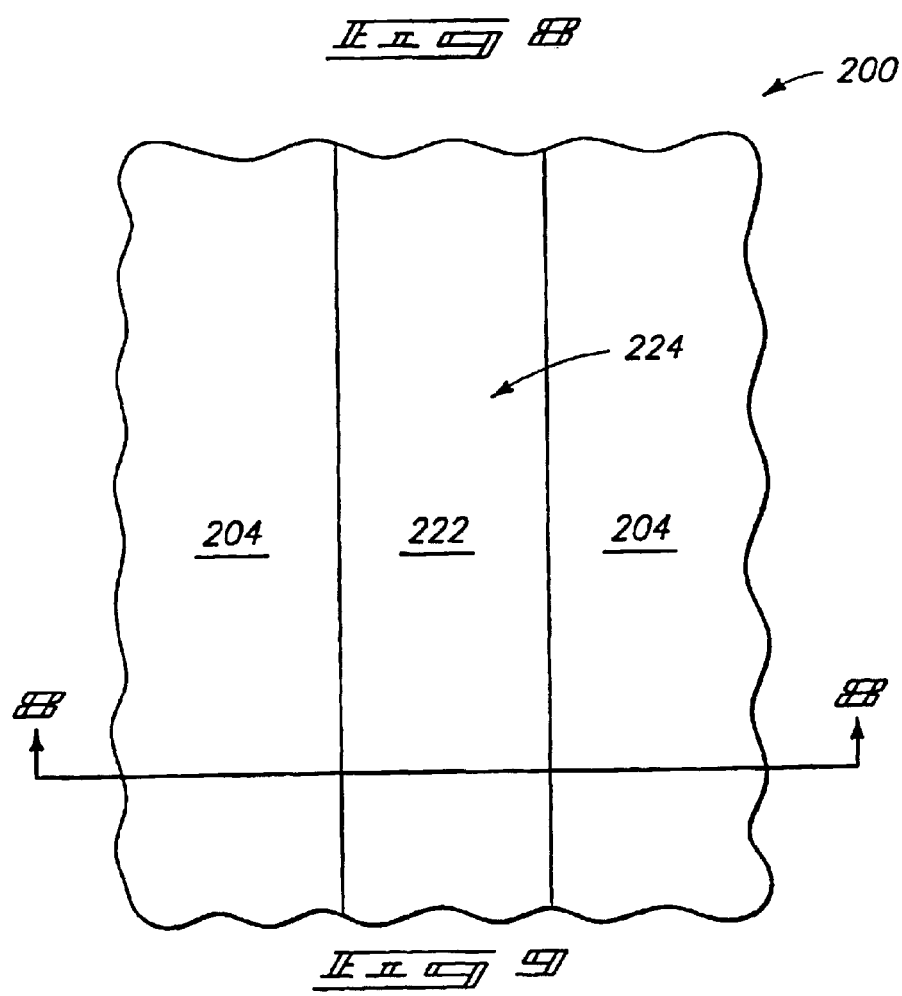
FIG. 9 is a diagrammatic top view of a portion of the wafer comprising the fragment of FIG. 8.

FIG. 9 illustrates a top view of a portion of the wafer 200 comprising the FIG. 8 construction, and shows that the stack 224 is in the shape of a line.

FIG. 10 shows the wafer portion of FIG. 9 at a processing step subsequent to that of FIG. 9, and specifically shows wordlines 14 formed across stack 224. FIG. 10 also shows stack 224 patterned into bit regions 230, 232 and 234. Such patterning removes layers 214, 216, 218, 220 and 222 (FIG. 8) from over layer 212, to leave exposed regions of layer 212 between bit regions 230, 232 and 234. In the shown construction, the bit regions 230, 232 and 234 have been patterned in a separate process from wordlines 14, so that regions 230, 232 and 234 extend outwardly from sidewalls of the wordlines 14. It is to be understood, however, that the invention encompasses other embodiments wherein the bit regions 230, 232 and 234 are patterned during an identical processing step as the patterning of wordlines 14, so that sidewalls of bit regions 230, 232 and 234 are coextensive with sidewalls of wordlines 14.

Although the shown embodiment has layer 212 exposed between bit regions 230, 232 and 234, it is to be understood that the invention encompasses other embodiments wherein an etch to pattern region 230, 232 and 234 extends through material 212, to expose conductive material 210 (FIG. 8) between bitline regions 230, 232 and 234.

Figure 11:
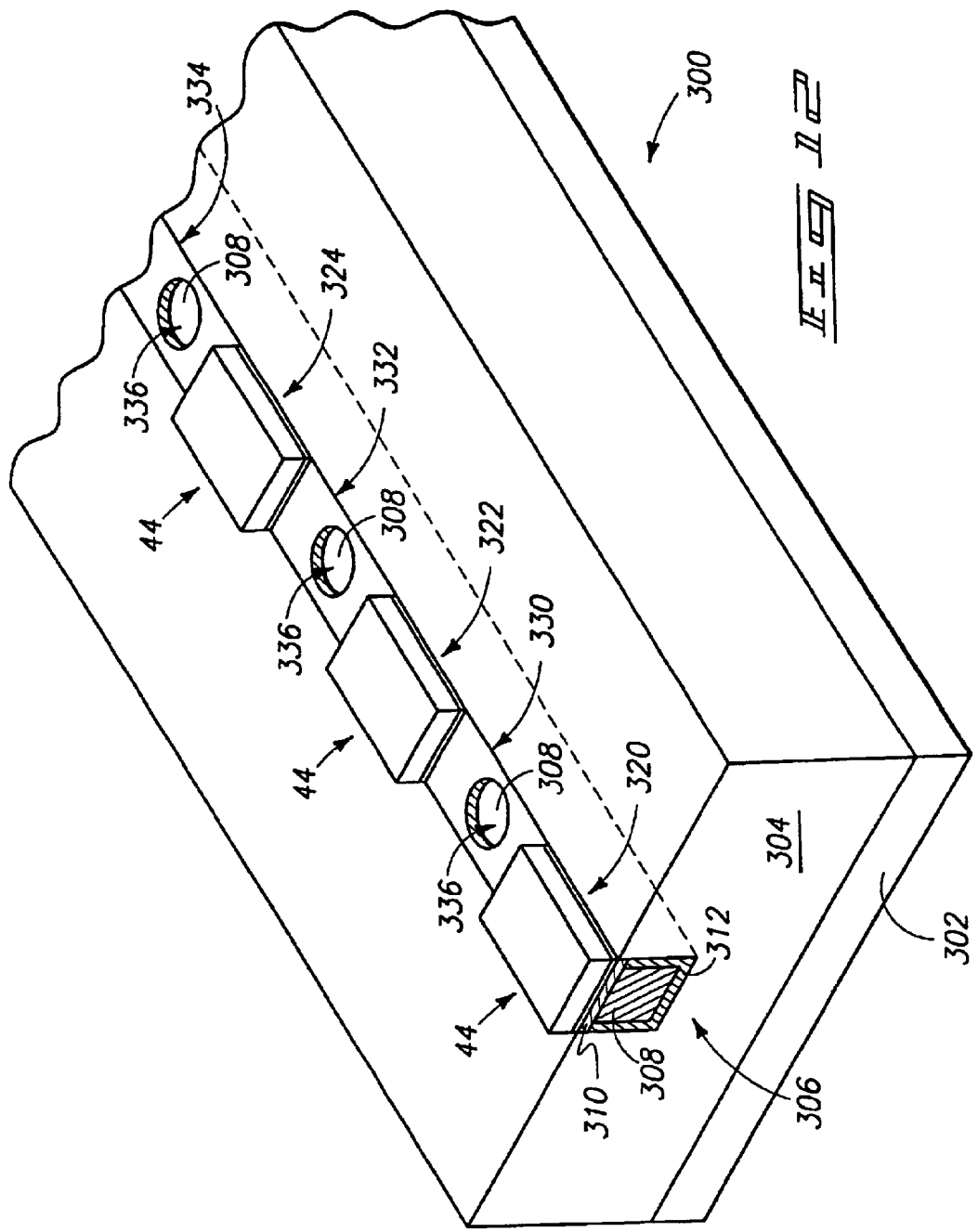
FIG. 11 is a diagrammatic, cross-sectional view of the FIG. 10 structure, shown along the line 11—11 of FIG. 10.
Figure 11:
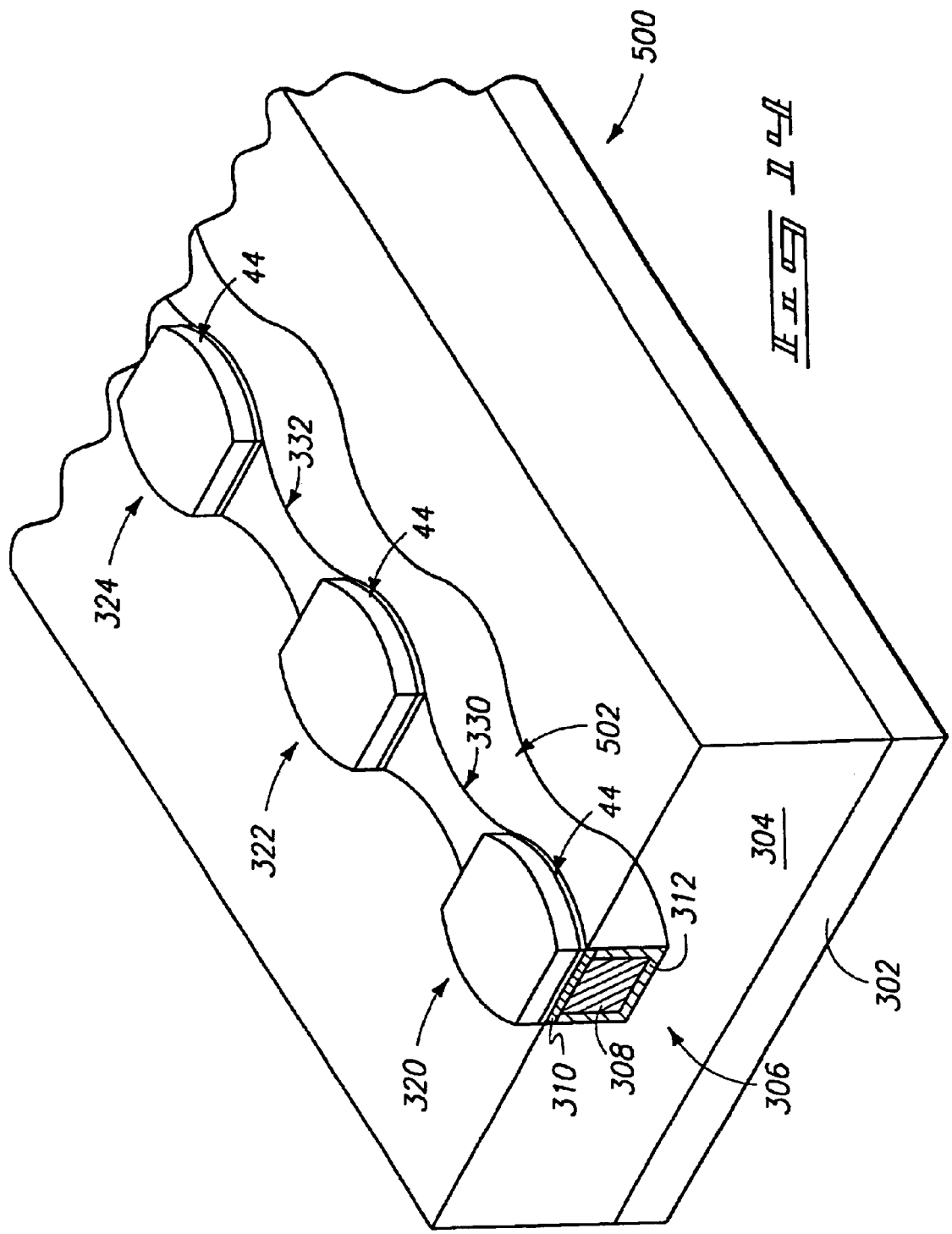

FIG. 11 shows a diagrammatic, cross-sectional view of a portion of the wafer portion of FIG. 10 along the line 11—11, and corresponds to a view utilized in FIGS. 3–8. Wordline 14 can be seen to comprise a pinning layer 72 and a conductive layer 70, as described above with reference to FIGS. 1 and 2. Further, the construction of FIG. 11 can be seen to correspond to a structure similar to that described with reference to FIG. 2, with the materials 208 and 210 corresponding to materials 20 and 16 of FIG. 2, and layers 212, 214, 216, 218, 220 and 222 corresponding to layers 18, 42, 46, 60, 48, and 62, respectively. Additional layers corresponding to the layers 50 and 64 of the FIG. 2 structure can be formed over the layer 222 of FIG. 11 so that the construction of FIG. 11 corresponds identically to the construction of FIG. 2.

In the shown construction, layers 220 and 72 both correspond to pinning layers. In particular applications, layer 222 can be entirely removed from over layer 220 prior to formation of wordlines 14, so that pinning layer 72 is in physical contact with pinning layer 220. Alternatively, layer 222 can correspond to a thin layer which allows magnetic properties associated with pinning layer 72 to influence properties associated with pinning layer 220.

The utilization of a pinning region having a component 72 which extends along an entire length of the top conductor can increase stability of the reference magnetic orientation by reducing a potentially stray field from top magnetic layers associated with a bit region. Additionally, or alternatively, the pinning region can be utilized to tune a magnetic field generated from top magnetic layers of the bit storage unit to produce a desired combination of stray field and stability. The pinning layers can comprise a combination of cobalt, ruthenium and cobalt layers and/or materials.

The action of writing to the bit storage unit construction of FIG. 11 can comprise rotation of the pinned magnetic layer and the sense layer to alignments which are parallel to the length of the bottom conductor. This can create a half select field to help flip the orientation of a magnetically thicker part of the magnetic bit atop the bottom conductor, which can in turn reverse the direction of the entire bottom bit. The writing can further comprise combined effects of magnetic field with the rotation of orientation of the pinned magnetic layer and sense layer from antiparallel parallel to parallel orientations, or vice versa. Preferably, the magnetic layer 212 will be of appropriate thickness and have other suitable properties such that combined effects of a magnetic field from top conductor 70 and a field generated by current through conductor 210 can exert enough force to reverse a magnetic orientation of a field propagating through layers 208 and 212 (as discussed above with reference to the field 30 in FIG. 2).

FIGS. 12–14 describe various embodiments of the present invention which can reduce magnetic cross-talk between adjacent bit regions. Referring initially to FIG. 12, a semiconductor wafer fragment 300 comprises a semiconductor substrate 302 and an insulative material 304. Substrate 302 and insulative material 304 can comprise constructions discussed previously with reference to semiconductor substrate 202 and insulative material 204, respectively, of FIG. 3.

A bitline 306 extends within a trench in insulative material 304. Bitline 306 comprises a conductive core 308 and magnetic materials 310 and 312 surrounding conductive material of core 308. Conductive core 308 can comprise identical materials as described above with reference to conductive core 16 of the FIG. 1 construction, and magnetic materials 310 and 312 can comprise identical materials as described above with reference to magnetic materials 18 and 20 of the FIG. 1 construction.

A plurality of spaced bit regions 320, 322 and 324 extend across bitline 306. Bit regions 320, 322 and 324 comprise stacks 44 identical to the stacks described previously with reference to FIGS. 1 and 2. Gap regions 330, 332 and 334 are defined along bitline 206 and between bit regions 320, 322 and 324.

Openings 336 are provided within gap regions 330, 332 and 334; and extend through magnetic material 310 to expose conductive core 308. Openings 336 can alleviate or prevent propagation of magnetic information from one bit region to another adjacent bit region, and accordingly can alleviate or prevent magnetic cross-talk between adjacent bit regions. Openings 336 effectively reduce an amount of magnetic material per unit area of gap regions 330, 332 and 334 relative to the amount of magnetic material per unit area in bit regions 320, 322 and 324.

In particular applications, magnetic cross-talk can be further alleviated by utilizing a magnetic material 312 having a grain size which alleviates propagation of magnetic information, in combination with openings 336 in magnetic material 310. Magnetic material 310 can have a grain size which would allow propagation of magnetic information, in that such materials may be desired as a top-most portion of a sense region. However, the openings 336 can prevent propagation of magnetic information through the magnetic material 310. Accordingly, magnetic cross-talk through material 310 is alleviated or prevented by forming the openings 336 within the material, and magnetic cross-talk through material 312 is alleviated or prevented by utilizing a material which readily generates domain walls, and therefore does not readily propagate magnetic information between adjacent bitline regions. A suitable material for magnetic layer 312 can comprise, for example, a material comprising cobalt, chromium and niobium, which can be deposited by, for example, sputter deposition. Such material has small grains, with the niobium and chromium content controlling grain size. Segregation along grain boundaries can decrease a strength of magnetic coupling between adjacent grains. Such can permit adjacent grains to have different magnetic orientations relative to one another, with minimal influence between the grains. Accordingly, magnetic orientation associated with one bit region can be isolated from another bit region by controlling the grain size of the material. A preferred material for magnetic layer 312 will support in-plane magnetization, and have a coercivity on within a range of from about 20 Oe to about 100 Oe.

Although the invention has been described with reference to utilization of a magnetic material 310 different from the material 312, it is to be understood that the invention encompasses other embodiments wherein magnetic material 310 comprises an identical material as 312. In such embodiments, magnetic material 310 could comprise cobalt, chromium and niobium, and accordingly be utilized without formation of openings 336 therein. Also, it is to be understood that another method for controlling interaction of adjacent bitline domains in applications in which layer 310 is more likely to propagate magnetic information than layer 312 is to reduce a thickness of magnetic layer 312 relative to magnetic layer 310.

FIG. 13 illustrates a semiconductor wafer fragment 400 showing yet another embodiment of the present invention. Similar numbering will be used in describing the embodiment of FIG. 13 as was used above in describing the embodiment of FIG. 12.

Wafer fragment 400 comprises the substrate 302 having the insulative material 304 thereover. Additionally, a trench is formed within insulative material 304 and bitline 306 extends within the insulative material. Openings 336 extend into magnetic material 310. A difference between the embodiment of FIG. 13 and that of FIG. 12 is that the openings 336 are formed to extend within material 312, as well as within material 310. The embodiment of FIG. 13 can be utilized in applications wherein magnetic material 312 and magnetic material 310 are both propagating magnetic cross-talk.

FIG. 14 illustrates yet another embodiment of the invention with reference to a semiconductor wafer fragment 500. Similar numbering will be used in referring to FIG. 14 as was utilized above in describing the embodiment of FIG. 12. A bitline 306 is shown extending within an insulative material 304. Bitline 306 comprises bitline regions 320, 322 and 324, and intervening regions 330 and 332 between the bitline regions. The bitline has curved sidewall surfaces 502, with such surfaces having a different amount of curvature in the regions 330 and 332 between the bitline regions 320, 322 and 324, than is present at the bitline regions 320, 322 and 324. The changing curvature can reduce magnetic cross-talk between adjacent bitline regions. In the shown embodiment, the regions 330 and 332 are shown to comprise narrower portions of bitline 306 than are present at bitline regions 302, 322 and 324. However, it is to be understood that the invention encompasses other embodiments (not shown) wherein the bitline regions are narrower than the intervening regions.

The embodiments of FIGS. 12, 13 and 14 can be combined to form yet other embodiments. For instance, the embodiment of FIG. 14 can be combined with embodiments from either FIG. 12 or 13 to form a bitline having curved sidewalls and openings formed in the magnetic materials at the intervening regions 330 and 332.

It is noted that the embodiments of FIGS. 12, 13 and 14 can focus a magnetic field at bitline regions 320, 322 and 324 by alleviating or preventing diffusion of the field across the intervening regions 330 and 332.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a magnetoresistive memory device, comprising:
    forming a trench in an insulative material;
    partially filling the trench with a first magnetic material to narrow the trench;
    at least partially filing the narrowed trench with a conductive material;
    forming a second magnetic material over the conductive material;
    forming a non-magnetic layer over the second magnetic material;
    forming a third magnetic material over the non-magnetic layer;
    incorporating the first and second magnetic materials, together with the conductive material, into a sense portion of the magnetoresistive memory device; and
    incorporating the third magnetic material into a reference portion of the magnetoresistive memory device.

2. The method of claim 1 wherein the non-magnetic layer comprises a dielectric material.

3. The method of claim 1 wherein the non-magnetic layer comprises $Al_2O_3$.

4. The method of claim 1 wherein the first and second magnetic materials are identical to one another.

5. The method of claim 1 wherein the first and second magnetic materials are different from one another.

6. The method of claim 1 further comprising patterning the second magnetic material, non-magnetic layer, and third magnetic material in a common patterning step.

7. The method of claim 1 further comprising:
    forming a spacer layer over the third magnetic material;
    forming a fourth magnetic material over the spacer layer;
    forming a protective non-magnetic material over the fourth magnetic material; and
    patterning the second magnetic material, non-magnetic layer, third magnetic material, fourth magnetic material, spacer layer and protective non-magnetic material in a common patterning step.

8. The method of claim 1 wherein the trench extends in a first direction; and further comprising:
    patterning the second magnetic material, non-magnetic layer, and third magnetic material in a common patterning step to form a stack; and
    forming a conductive line over the stack, the conductive line extending in a direction substantially perpendicular to the first direction.

9. The method of claim 1 wherein the trench extends in a first direction; and further comprising:
    first patterning the second magnetic material, non-magnetic layer, and third magnetic material in a common patterning step to form a line comprising the second magnetic material, non-magnetic layer and third magnetic material; the line extending along and over the conductive material;
    second patterning the third material to form a plurality of spaced blocks over the conductive material; and
    forming a plurality of spaced conductive lines over the spaced blocks, the conductive lines extending in a direction substantially perpendicular to the first direction.

10. The method of claim 9 wherein further comprising removing at least some of the second magnetic material from between the spaced blocks.

11. The method of claim 9 wherein the non-magnetic material is patterned with the third magnetic material during the second patterning.

12. The method of claim 9 wherein the first magnetic material is different than the second magnetic material.

13. The method of claim 9 wherein the first magnetic material is different than the second magnetic material; wherein the first magnetic material comprises cobalt, chromium and niobium; and wherein the second magnetic material comprises iron and nickel.

14. The method of claim 9 further comprising removing at least some of the first magnetic material from between the spaced blocks.

15. The method of claim 1 wherein the trench extends primarily in a first direction and comprises curvaceous sidewalls; the method further comprising:
    patterning the second magnetic material, non-magnetic layer, and third magnetic material in a common patterning step to form a line comprising the second magnetic material, non-magnetic layer and third magnetic material; the line extending along and over the conductive material;
    second patterning the third material to form a plurality of spaced blocks over the conductive material; the sidewalls of the trench having a different amount of curvature in regions between the blocks than in regions beneath the blocks; and
    forming a plurality of spaced conductive lines over the spaced blocks, the conductive lines extending in a direction substantially perpendicular to the first direction.

16. The method of claim 15 wherein further comprising removing at least some of the second magnetic material from between the spaced blocks.

17. The method of claim 15 wherein the non-magnetic material is patterned with the third magnetic material during the second patterning.

18. The method of claim 15 wherein the first magnetic material is different than the second magnetic material.

19. The method of claim 15 wherein the first magnetic material is different than the second magnetic material; wherein the first magnetic material comprises cobalt, chromium and niobium; and wherein the second magnetic material comprises iron and nickel.

20. The method of claim 15 further comprising removing at least some of the first magnetic material from between the spaced blocks.

* * * * *

UNITED STATES PATENT AND TRADEMARK OFFICE
CERTIFICATE OF CORRECTION

PATENT NO. : 6,780,655 B2
DATED : August 24, 2004
INVENTOR(S) : Mattson

It is certified that error appears in the above-identified patent and that said Letters Patent is hereby corrected as shown below:

Title page,
Item [56], References Cited, U.S. PATENT DOCUMENTS, replace "2003/0146439 A1" with -- 2003/0146459 --.
insert -- OTHER PUBLICATIONS,
http://philly.com/cont...nquirer/2000/08/10/tech_life/MRAM10.html; The Philadelphia Inquirer; *"Computers to get a good, swift boot"*; by Leslie J. Nicholson; August 10, 2000 (reprinted 7/24/01). --.

Signed and Sealed this

Twelfth Day of July, 2005

JON W. DUDAS
*Director of the United States Patent and Trademark Office*